United States Patent [19]
Lee et al.

[11] Patent Number: 6,025,244
[45] Date of Patent: Feb. 15, 2000

[54] SELF-ALIGNED PATTERNS BY CHEMICAL-MECHANICAL POLISHING PARTICULARLY SUITED TO THE FORMATION OF MCM CAPACITORS

[75] Inventors: Michael G. Lee, San Jose; Solomon I. Beilin, San Carlos, both of Calif.

[73] Assignee: Fujitsu Limited, Japan

[21] Appl. No.: 08/984,984

[22] Filed: Dec. 4, 1997

[51] Int. Cl.[7] .................................................. H01L 21/20
[52] U.S. Cl. ............................................ 438/386; 438/243
[58] Field of Search ..................................... 438/243, 254, 438/255, 256, 386, 397, 398, 399, 691, 692, 740, 3; 361/313

[56] References Cited

U.S. PATENT DOCUMENTS

| | | |
|---|---|---|
| 4,956,313 | 9/1990 | Cote et al. . |
| 5,137,597 | 8/1992 | Curry, II et al. .......................... 156/636 |
| 5,234,868 | 8/1993 | Cote . |
| 5,246,884 | 9/1993 | Jaso et al. . |
| 5,264,387 | 11/1993 | Beyer et al. . |
| 5,272,117 | 12/1993 | Roth et al. . |
| 5,292,677 | 3/1994 | Dennison . |
| 5,314,843 | 5/1994 | Yu et al. . |
| 5,318,663 | 6/1994 | Buti et al. ................................ 156/636 |
| 5,328,553 | 7/1994 | Poon ........................................ 156/636 |
| 5,334,281 | 8/1994 | Doerre et al. ............................ 156/636 |
| 5,356,513 | 10/1994 | Burke et al. ............................. 156/636 |
| 5,395,801 | 3/1995 | Doan et al. . |
| 5,627,094 | 5/1997 | Chan et al. .............................. 438/253 |
| 5,708,559 | 1/1998 | Brabazon et al. ....................... 361/313 |
| 5,726,084 | 3/1998 | Boyd et al. .............................. 438/239 |
| 5,858,870 | 1/1999 | Zheng et al. ............................. 438/622 |

*Primary Examiner*—Tuan H. Nguyen
*Attorney, Agent, or Firm*—Coudert Brothers

[57] ABSTRACT

Methods of forming a self aligned layers using a polishing step are disclosed. In an exemplary embodiment, a first layer of a first material is formed over an existing layer such that the first layer substantially conforms to and reproduces the pattern of the existing layer, with high and low portions whose locations correspond to the locations of the high and low portions, respectively, of the existing layer. Contrary to the practices of the polishing-planarization art, the first layer is formed such that its low portions are below the height of the high portions of the existing layer. Next, a relatively thin polish-stop layer of a second material is formed over the first layer such that the polish-stop layer substantially conforms to and reproduces the pattern of the first layer. The layers are then polished to remove the portions of the first layer and polish-stop layer which lie above the plane of the low portions of the polish-stop layer, and to provide a substantially flat surface. The remainder of the polish-stop layer is removed by a chemical etch. The first the first layer is thereby self-aligned and directly abutting to the existing layer with a complementary pattern. The methods according to the present invention can achieve precise self-alignment of the layers over large area wafers.

24 Claims, 4 Drawing Sheets

SELF-ALIGNED PATTERNS BY CHEMICAL-MECHANICAL POLISHING PARTICULARLY SUITED TO THE FORMATION OF MCM CAPACITORS

FIELD OF THE INVENTION

The present invention relates to patterning material layers on semiconductor wafers and the like, and the use of chemical-mechanical polishing. The present invention is particularly suited to the formation of substrate and MCM capacitors.

BACKGROUND OF THE INVENTION

Most recently, chemical-mechanical polishing (CMP) processes have been used to planarize the surface of wafers and the like in preparation for device fabrication, or to re-planarize the surface of a partially fabricated wafer so as to aid in the remaining construction steps. The CMP process usually involves holding a thin, flat semiconductor wafer against a rotating polishing pad which is wetted with a slurry, and which is pressed against the polishing pad with a controlled downward pressure. The polishing slurry usually comprises alumina or silica particles in a colloidal liquid suspension, usually water based, and may have chemical etchants added thereto. For example, many water based slurries comprise metal hydroxide compounds (bases) or inorganic acids as etchants, which make the slurry basic or acidic, respectively. A rotating polishing head or wafer carrier is typically used to hold the wafer under a controlled pressure (i.e., force) against the rotating pad, which in turn is supported by a platen. The polishing pad, which is typically adhered to the platen, typically comprises a urethane or polyurethane material.

The chemical-mechanical polishing process usually employs two types of etching processes, a mechanical etching caused by the abrasion of the silica or alumina particles, and a chemical etching caused by the etchants added to the slurry. A common approach is to add a chemical which converts the material to be etched to another form, which may then be more readily removed by the mechanical abrasion of the silica and alumina particles.

The primary focus and use of chemical-mechanical polishing in the art has been as a tool for planarizing surfaces. Typically, a thick layer of material is formed over the irregular wafer surface to be planarized, and then the thick material layer is polished back to the point where the tops of the irregular features on the wafer surface begin to be exposed, at which point the polishing process is stopped. This thick planarizing layer is so thick that its top surface is relatively flat, thereby retaining little, if any, of the irregular bumps of the underlying irregular features. The flatness in the top surface of the planarizing layer enables the CMP process to uniformly polish back the layer to the tops of the irregular features.

Against this backdrop, the inventors contemplate a very different use of the CMP process.

SUMMARY OF THE INVENTION

To the knowledge of the inventors, no serious thought has been given by the prior art to use the chemical-mechanical polishing process as a substitute for the photo-lithographic patterning of material layers in device fabrication, particularly the formation of substrate capacitor structures, and more specifically for using the polishing process to pattern a layer with a pattern which is complementary and directly abutting to an underlying layer without the need for photo-lithographic process steps.

Broadly stated, the present invention encompasses methods of forming a layer over an existing substrate layer with a pattern which is complementary and self-aligned to the pattern of the existing layer, and is preferably directly abutting (i.e., no gaps) to the pattern of the existing layer. The patterned existing layer has low portions spaced from the surface of the substrate by a first height (or spacing distance) and high portions spaced from the surface of the substrate by a second height (or spacing distance), which is greater than the first height. The difference between the first and second heights will be represented herein as a distance "D".

Broadly stated, methods according to the present invention comprise the step of forming a first layer of a first material over the existing layer such that the first layer substantially conforms to and reproduces the pattern of the existing layer, preferably including its sidewalls, and has high and low portions whose locations correspond to the locations of the high and low portions, respectively, of the existing layer. A polish-stop layer of a second material is formed over the first layer such that the polish-stop layer substantially conforms to and reproduces the pattern of the first layer, preferably including its sidewalls, and has high and low portions whose locations correspond to the locations of the high an low portions, respectively, of the first layer. The layers are then polished, preferably by a chemical mechanical polishing process, such that the high portions of the first layer and polish-stop layer are removed to expose the high portions of the existing layer. Preferably, each of the first layer and polish-stop layer is formed such that its low portions are below the high portions of the existing layer, thereby giving a self-aligned, directly abutting, and complementary pattern in conjunction with its conformal formation to the existing layer. In preferred embodiments of the present invention, the chemical composition of the first layer is different from that of the existing layer, and different from that of the polish-stop layer.

As used herein to describe the formation of a conformal layer over an existing layer (or underlying layer), the term "conformal" means that the conformal layer has substantially the same thicknesses at its high and low portions, and that conformal layer has vertical sidewalls adjacent to the vertical sidewalls of the existing layer. The thickness of the conformal layer along its vertical sidewalls does not exceed the thickness of the low portions of conformal layer by more than 10%. The use of conformal layers according to the present invention is contrary to the teachings of the polishing art, where the planarizing layers used therein are deposited such that the thickness over the high portions of the existing layer is substantially less than the thickness over the low portions of the existing layer, so as to planarize the exposed surface of the planarizing layer. Because of their large thicknesses, such planarizing layers of the prior art do not have vertical sidewalls which are adjacent to the vertical sidewalls of the existing layer.

As is known in the art, photolithographic processing steps have alignment errors due to inaccuracies in the machinery, and due to changes in temperature that occur during the photolithographic processing steps. The temperature changes cause the dimensions of the various masks used in the processes to change in size such that they no longer match one another or match the patterns previously formed on the working substrate. These problems are obviated with the use of the present invention, which exactly aligns and abuts a second layer precisely with a first regardless of temperature changes during processing or inaccuracies in the machinery.

A preferred application of the present invention is the construction of substrate capacitors having two electrodes and an intermediate dielectric layer. Exemplary methods for this application according to the present invention comprise forming a first patterned layer of a conductive material over a substrate, which will be the bottom electrode of the capacitor. The pattern of the first layer has low portions spaced from the surface of the substrate by a first height (or spacing distance) and high portions spaced from the surface of the substrate by a second height (or spacing distance) which is greater than the first height. The high portions will serve as electrical connection points to the capacitor's bottom electrode after fabrication is completed. Next a second layer of a dielectric material is formed over the first layer such that the second layer substantially conforms to and reproduces the pattern of the first layer, having high and low portions whose locations correspond to the locations of the high an low portions, respectively, of the first layer. The thickness of the second layer is selected such that the low portions of the second layer are below the high portions of the first layer. Next, a third layer of a conductive material is formed over the second (dielectric) layer such that the third layer substantially conforms to and reproduces the pattern of the second layer, having high and low portions whose locations correspond to the locations of the high an low portions, respectively, of the second layer. The conductive third layer will provide the top electrode of the capacitor structure after fabrication, and the low portions of the third layer will provide connections points to the capacitor's top electrode. Preferably, the low portions of the third layer are below the high portions of the first layer. Next, a polish-stop layer is formed over the third layer such that the polish-stop layer substantially conforms to and reproduces the pattern of the third layer, having high and low portions whose locations correspond to the to the locations of the high an low portions, respectively, of the third layer. Preferably, the low portions of the polish-stop layer are below the high portions of the first layer. Also, the chemical composition of the polish-stop layer is preferably different from that of the third layer so as to increase the selectivity of a subsequent polishing step. The first layer and the conformal layers above it are then polished, preferably by a CMP process, such that the high portions of the first layer are exposed. The polish-stop layer may then be removed. The resulting structure has two conductive layers which have complementary and self-aligned patterns, and which are directly abutting to an intermediate dielectric layer which electrically insulates the conductive layers.

Accordingly, it is an object of the present invention to enable polishing processes and chemical-mechanical processes to form complementary and self-aligned layers without the need for conventional photo-lithographic steps.

It is an another object of the present invention to enable polishing processes and chemical-mechanical processes to form self-aligned layers which directly abut to one another without the need for conventional photo-lithographic steps.

It is another object of the present invention to enable substrate capacitors, multichip module capacitors, and multilayer interconnect structures to be formed quickly and efficiently with a polishing process.

These and other objects of the present invention will become apparent to those skilled in the art from the following detailed description of the invention, the accompanying drawings, and the appended claims.

DETAILED DESCRIPTION OF THE INVENTION

Figure 1:
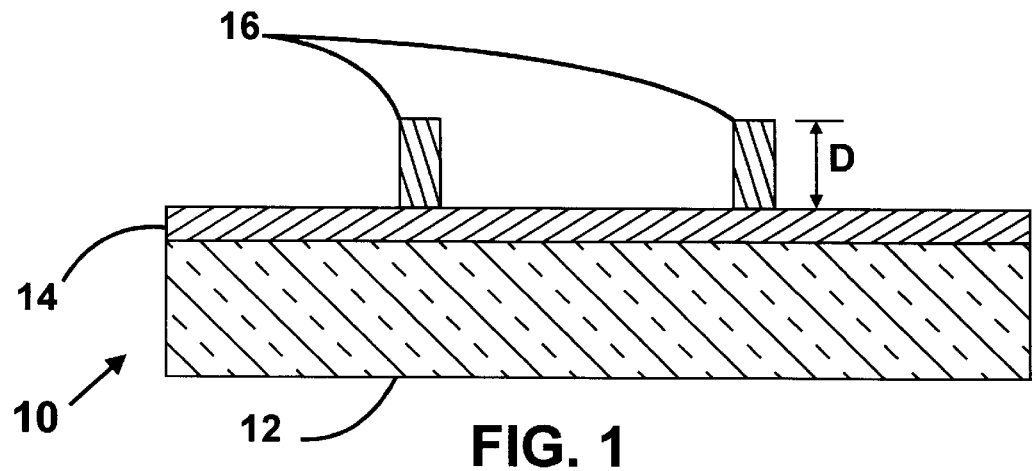
FIGS. 1–8 are cross-sectional views of an exemplry capacitor structure being constructed according the methods of the present invention.

FIGS. 1 through 8 show cross-sectional views of an exemplary device being constructed by exemplary methods according to the present invention. Referring to FIG. 1, a base substrate 12, which may comprise silicon, is provided and a conductive layer 14 is formed over the top surface of substrate 12 by any number of well known deposition methods. For example, the following depositions methods may be used: sputtering, evaporation, chemical vapor deposition and electroplating (with a starting seed layer formed over substrate 12). Although sputtering and electroplating are currently preferred methods, the particular method employed is not critical to the present invention.

Once having formed layer 14, conductive posts 16 are formed over layer 14 at selected locations. Posts 16 may be constructed by forming a photoresist layer or polyimide layer over layer 14, etching apertures in this layer where posts 16 are to be formed, and thereafter electroplating or sputtering material within the apertures to form posts 16. Other methods may be used to construct posts 16, and the particular choice thereof is not critical to practicing the present invention. The exemplary structure which will be formed and illustrated by FIGS. 1 through 8 may comprise a substrate capacitor structure in which layer 14 and posts 16 collectively comprise the bottom electrode of the capacitor. The composite electrode collectively formed by layer 14 and posts 16 comprises a patterned layer having low portions spaced from the top surface of substrate 12 by a first height (i.e., the thickness of layer 14), and high portions spaced from the top surface of substrate 12 by a second, and greater, height (i.e., the combined thickness of layer 14 and height of post 16). The difference between the first and second heights will be represented herein as a distance "D", which is shown in FIG. 1. Given this existing composite layer, exemplary methods according to the present invention will form a second patterned layer over the existing layer with a polishing step, such that the second layer has a complementary pattern, and is self-aligned and directly abutting against the existing layer. Moreover, the exemplary methods according to the present invention can form the second layer without the need of conventional photolithographic processing steps.

Figure 2:
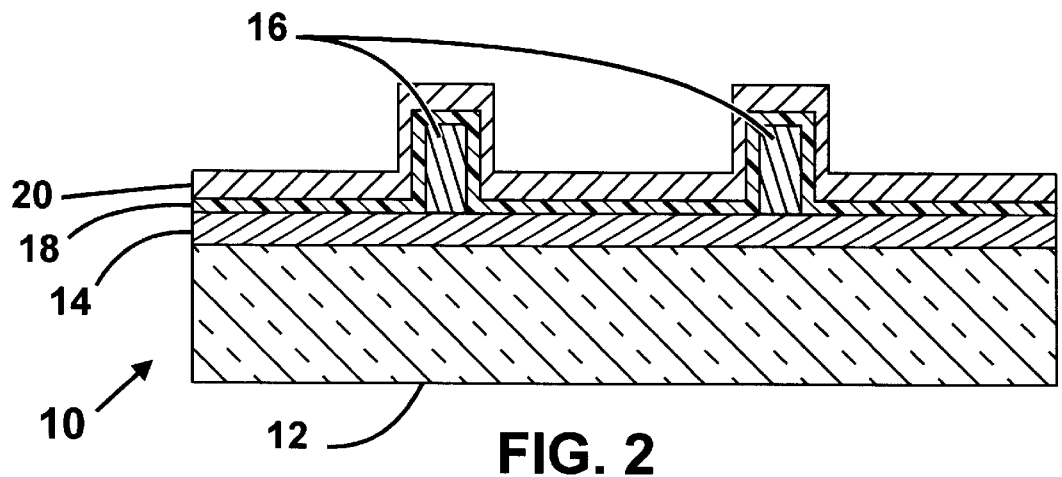

Referring to FIG. 2, a second layer 18 is conformally deposited or otherwise formed over the composite electrode formed by layer 14 and posts 16. In preferred embodiments of the present invention, layer 18 comprises a dielectric material, such as tantalum pentoxide, silicon dioxide, polyimide, or the like. For capacitor structures, tantalum pentoxide has the advantage of a very high dielectric constant (on the order of 25). Since layer 18 is formed conformally, it has high and low portions whose locations substantially correspond to the high and low portions, respectively, in the existing composite layer formed by layer 14 and posts 16. It also has vertical sidewalls which cover the sidewalls of posts 16. In preferred embodiments of the present invention, the height of the low portions of layer 18 is kept below the level of the high portions of posts 16.

Figure 3:
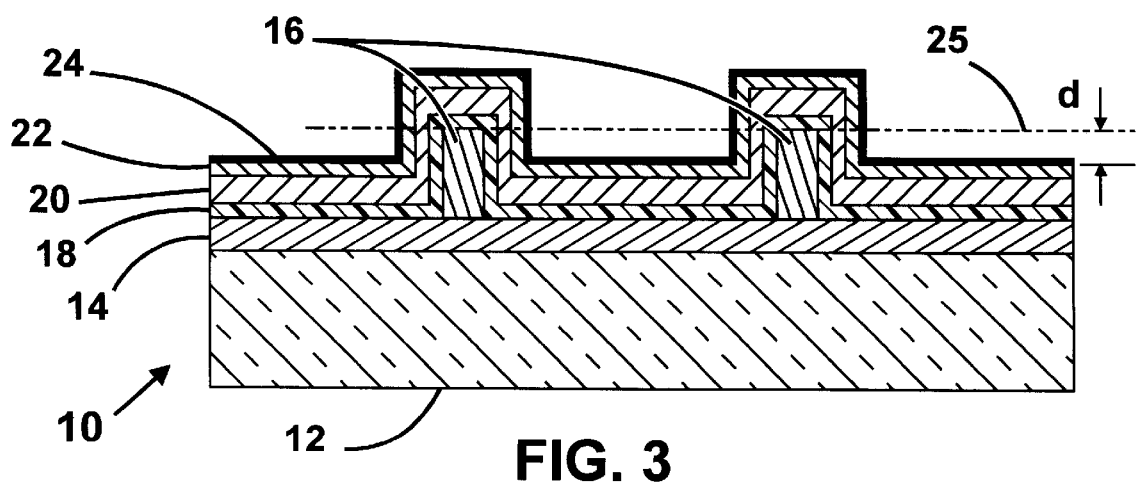

Next, a conductive layer 20 is similarly formed over layer 18 such that it is conformal with layer 18. Layer 20 has high and low portions whose locations correspond respectively to high and low portions of layer 18. Layer 20 has vertical sidewalls which cover the sidewalls of layer 18. In preferred embodiments of the present invention, the top surfaces of the lower portions of layer 20 lie below the level of the high portions of posts 16. In an exemplary capacitor embodiment constructed according to the present invention, layer 20 will form the top electrode of the capacitor. The chemical composition of layer 20 may be the same as or different from the materials used in constructing layer 14 and posts 16. Referring to FIG. 3, an optional adhesion layer 22 may be conformally formed over layer 20. Layer 22 preferably comprises chromium, which provides very good adherence (e.g., bonding strength) to polyimide and polymeric materials. Chromium is also conductive, which will enable vias to be readily formed through an overlying polyimide layer to make electrical contact to the chromium layer, and in turn to the top electrode provided by layer 20.

Besides serving as an adhesion layer for polymeric materials, layer 22 may also serve the important function of a material diffusion barrier which keeps material in layer 20 and material subsequently deposited over layer 20 from adversely reacting with one another. As is known in the art, copper can have adverse reactions with some polyimide materials, and chromium and nickel are often used as effective barrier layers between these two types of materials. Such barrier layer applications require precise alignment of the barrier layer (22) over the underlying layer (20), which is easily achieved by the methods according to the present invention. Such barrier layers also require good sidewall coverage to the underlying material which they are to protect, and this requirement is also easily meet by the present invention. Thus, in addition to providing a low cost and efficient construction method for substrate capacitors, methods according to the present invention provide low cost and precise ways of aligning barrier layers over their respective patterned layers which are to be protected.

Next, a polish-stop layer 24 is conformally formed over layer 22, and thereby the previous layers. A horizontal line 25 has been drawn in FIG. 3 to indicate the level of the top portions of posts 16. The tops of all layers 18, 20, 22, and 24 lie below this line 25 by a distance of at least "d", and thus the structure may be polished to expose the top surfaces (high portions) of posts 16 without removing the low portions of layers 18, 20, 22, and 24. The vertical sidewalls of polish-stop layer 24 protect the sidewalls of layer 22, which is important when layer 22 acts as a barrier layer. Without the sidewalls of polish-stop layer 24, dishing may occur around the top of post 16 which would erode a surrounding portion of the barrier layer 22. Polish-stop layer 24 may be relatively thin in comparison to the amount of material that is to be removed (which at most is equal to the height of post 16) because the material is more resistant to abrasion and since the surface area of the material to be removed is much smaller than the area of the lower, stopping, portions of layer 24. Typically, the thickness of polish-stop layer 24 is less than 20% of the thickness of layer 18, 20 or 22, whichever is larger, and is usually less than 10% of the height of post 16 (%=percent).

In view of the polishing step that will subsequently follow, the material (e.g., chemical composition) of polish-stop layer 24 is selected such that the material is polished away at a slower rate than the respective materials of layers 18, 20, and 22, and the material of posts 16. Tungsten metal is an exemplary choice for stop layer 24, particularly when layer 22 comprises chromium, when posts 16 and layer 20 comprise materials such as copper, aluminum, or tantalum, when dielectric layer 18 comprises material such as polyimide, tantalum pentoxide, or silicon dioxide, and when alumina slurry is used (silica slurry may be used if the pH of the slurry is adjusted to a value less than 5, and preferably less than 4). Because layers 18 and 22 are relatively thin in typical capacitor applications, they do not weigh heavily in the selection of an appropriate material for polish-stop layer 24 for the typical case. In such a typical case, the choice is mainly determined by selecting a material for polish-stop layer 24 that does not polish away as fast as the material for posts 16 and layer 20. In general, metals and common fabrication materials have been measured and ranked for hardness (e.g., Vicker's scale, Rockwell scale), and the hardness indexes for these materials have been widely published and serve as a good guideline for selecting materials for polish-stop layer 24. In general, it is desirable to have a material for polish-stop layer 24 which has a higher hardness index than the material for posts 16.

Figure 4:
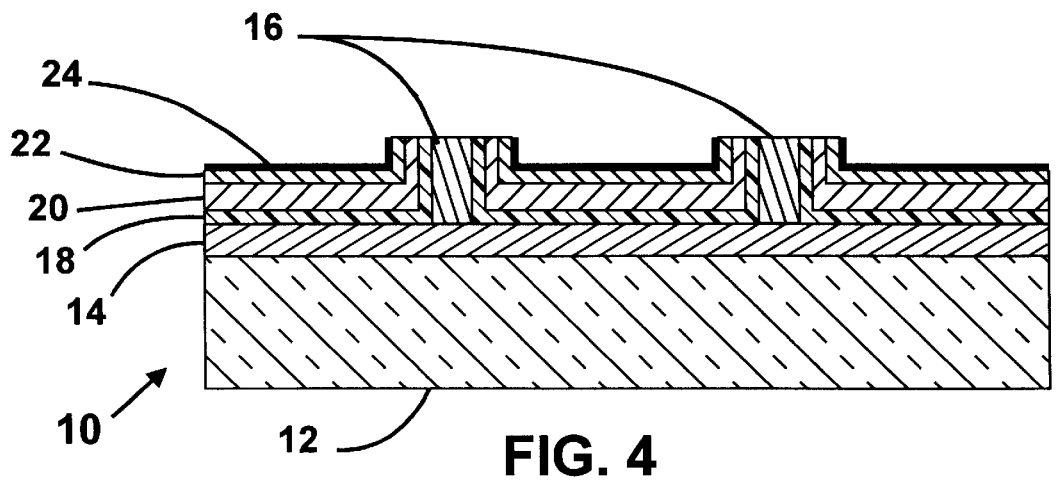
Figure 5:
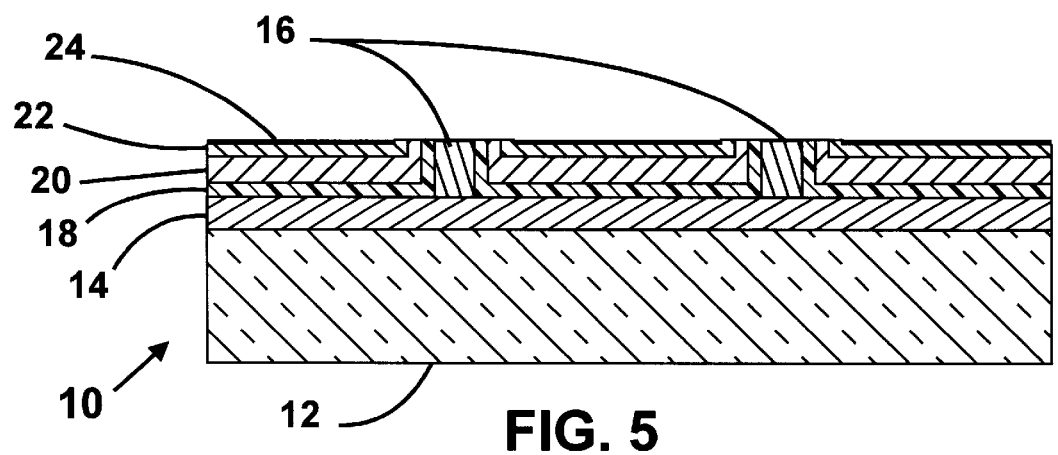

Referring now to FIG. 4, the top surfaces of deposited layers 18–24 are polished using a conventional polishing process with plain slurry, or using a chemical mechanical polishing process using slurry with an appropriate etchant or additive added thereto. In the latter case, an etchant may be added which accelerates the remove of material from layer 20 and posts 16, or an additive may be added to retard the mechanical etching of polish-stop layer 24 while not affecting the mechanical etching rate of the other layers and posts 16. The latter approach can provide better control of the polishing process, albeit at a cost of a longer polishing time. As one example, phosphoric acid acts as a retardant for tungsten (for polish-stop layer 24) without significantly affecting the etching rate of copper, as is disclosed in pending U.S. patent application Ser. No. 08/717,266, entitled "Methods of Planarizing Structures on Wafers and Substrates by Polishing," which is assigned to the same assignee. The phosphoric acid is added to the slurry in an amount which causes the pH of the slurry to decrease to a value of approximately 5 or below, and preferably to a pH value between about 2 and about 4. The structure is polished until at least the top surfaces of posts 16 are exposed, as shown in FIG. 4, and is preferably continued until the tops of posts 16 are polished to be substantially even with the top of stop layer 24, as shown in FIG. 5. In the process of polishing posts 16 down to this level, a portion of polish-stop layer 24 is etched away, as shown in FIG. 5.

The result is that layers 18, 20, and 22 are each patterned with a complementary pattern to that of posts 16, and that the alignment of the patterns in these layers is extremely precise and abut to one another. Moreover, the complementary patterns have been aligned without the need for any photolithographic steps. As is known in the art, photolithographic processing steps have alignment errors due to inaccuracies in the machinery, and due to changes in temperature under which the various photolithographic processing steps are carried out. These temperature changes cause the dimensions of the masks used in the processes to change, such that they no longer match one another or the patterns formed on the substrate. These problems are obviated with the use of the present invention, which exactly aligns one layer (e.g., layers 18 or 20 or 22) precisely with another layer (e.g., the composite of posts 16 and layer 14) and directly abutting thereto regardless of temperature changes during processing and without encountering thermal mismatch problems.

Although polish-stop layer 24 is formed over layer 22 such that its high and low portions have the same thickness, the high portions of polish-stop layer 24 will be polished off before the low portions thereof since the high portions will contact the polishing pad before the low portions. The corners, edges and sidewalls around the high portions of layer 24 will receive considerable abrasion from the polishing pad due to its flexibility. The tangential etching of these exposed features helps to accelerate the removal of the top portions of layer 24 with respect to the removal rate for the low portions of layer 24, which do not have these exposed features. Also, the surface area of the high portions of layer 24 is less than the surface area of substrate 12, which causes the high portions to undergo a greater downward force against the polishing pad than the low portions since the applied pressure from the substrate carrier is distributed over an area smaller than the substrate surface area when only the high portions of layer 24 are being polished. In the typically case, the surface area of the high portions is also less than the surface are of the low portions of layer 24.

The smaller amount of surface area in the high portions of posts 16 and layers 18–24 is advantageous because it enables a polishing process to more quickly remove the high portions of posts 16 and layers 18–24 to a level between the tops of posts 16 and the low portions of layer 24. The accelerated removal rate reduces "dishing" on the substrate surface and a more uniform leveling of the posts 16 is achieved. ("Dishing" occurs when the polishing process over-polishes an area of the substrate to cause a dish-shaped depression in that area which falls below the desired planarization level). These advantages ensure that the aligned patterns around the polished top surface of posts 16 are precise and do not lose their dimensional integrity due to non-uniform polishing or dishing around a post location. These advantages may be achieved by keeping the aggregate cross-sectional areas of posts 16 to less than 20%, and more preferably to less than 10%, of the total surface area of substrate 12. Under these conditions, the aggregate surface area of the high portions of layer 18 will be roughly less than 20% (and preferably less than 10%) of total surface area of high and low portions combined (which is usually equal to the surface area of substrate 12). Likewise, the aggregate surface area of the high portions in each of the other layers 20, 22, and 24 will be roughly less than 20% (and preferably less than 10%) of the total surface area.

Figure 9:
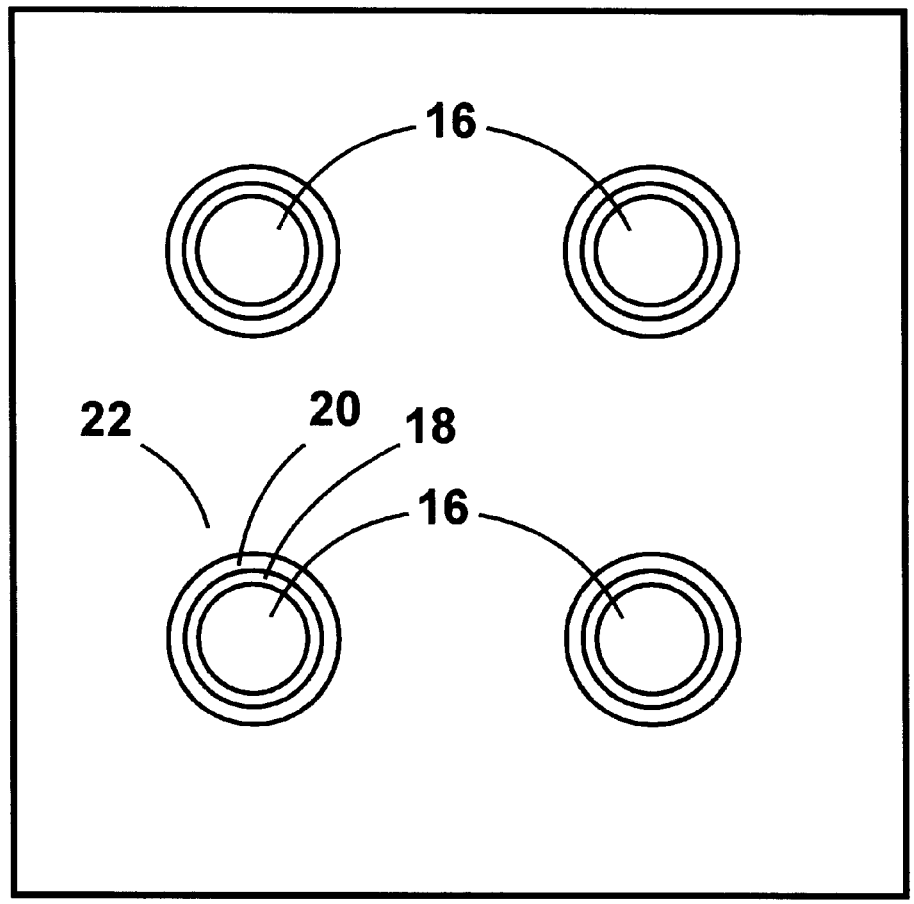
FIG. 9 is a top plan view of the capacitor structure after polishing and removal of the remaining polish-stop layer, showing the self-aligned layers according to the present invention.

Polish-stop layer 24 may be removed by a wet chemical etchant that selectively etches the material of the layer with respect to the materials of posts 16, and layers 18, 20, and 22. For example, hydrogen peroxide ($H_2O_2$) may be used to readily etch tungsten without damaging many underlying materials, such as copper and chromium. A top plan view of the resulting structure is shown in FIG. 9, which shows the self-aligned property of the layers.

Figure 6:
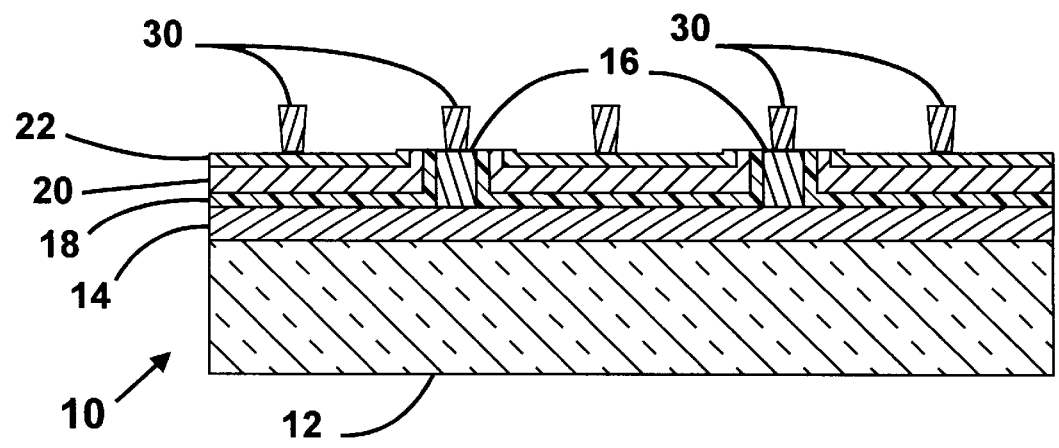

As an optional further step, connection posts 30 may be formed over posts 16 at selected locations of layer 22, which is electrically conductive and connected to layer 20, as shown in FIG. 6. These posts will serve to connect the capacitor structure formed by layers 14, 18 and 20 to signal layers and chips that will be subsequently disposed above layer 22. Posts 30 may be readily formed by first forming a thick layer of photoresist, patterning the photoresist layer to define apertures in which posts 30 will be formed, and then depositing, sputtering, or plating conductive material within the photoresist apertures. Prior to these steps, a plating seed layer may be uniformly formed over the surface of layer 22 (such as by sputtering and other deposition methods) to provide a current path for an electrolytic plating process. The seed layer is later etched away after posts 30 have been formed. (The seed layer may be omitted if the plating current can be coupled to layer 14 as well as layer 22, and if material can be plated onto layer 22 without a problem.) As is known in the art, electroless plating processes do not require an electrical current and often do not require a seed layer, though they usually require a surface activation treatment, which usually comprises treating the surface with a palladium catalyst solution.

Any typical plating solution may be used in electroplating posts 30. The inventors have used a typical electrolytic electroplating process using commercially available plating solutions, which typically comprise 4% copper sulfate by weight, 15% sulphuric acid by weight, and various additives (i.e., surfactants, brighteners) in an aqueous solution. Prior to the plating step, the wafer may be first wetted by a 1% sodium lauryl sulfate aqueous solution to wet the surfaces of the substrate, and thereafter soaked the wafer in the plating solution for a short time prior to activating the plating current.

Figure 7:
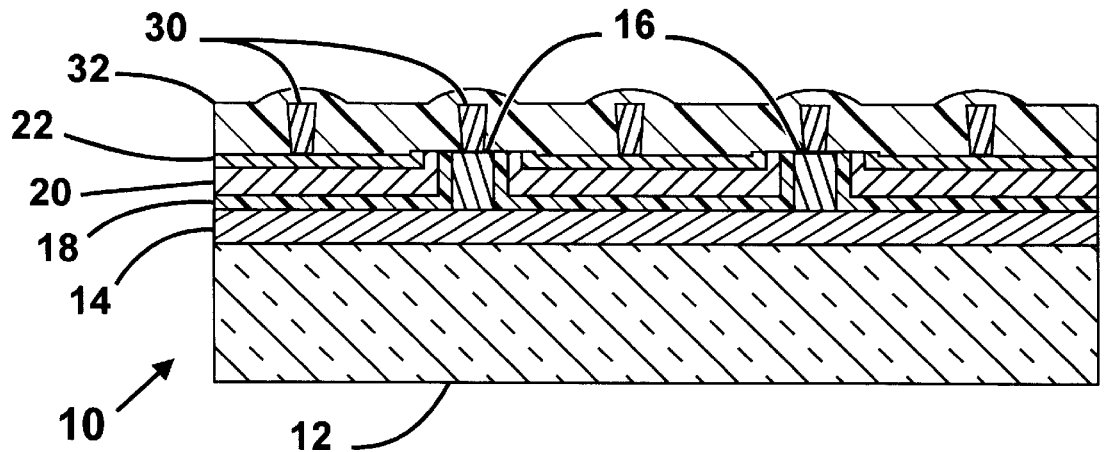
Figure 8:
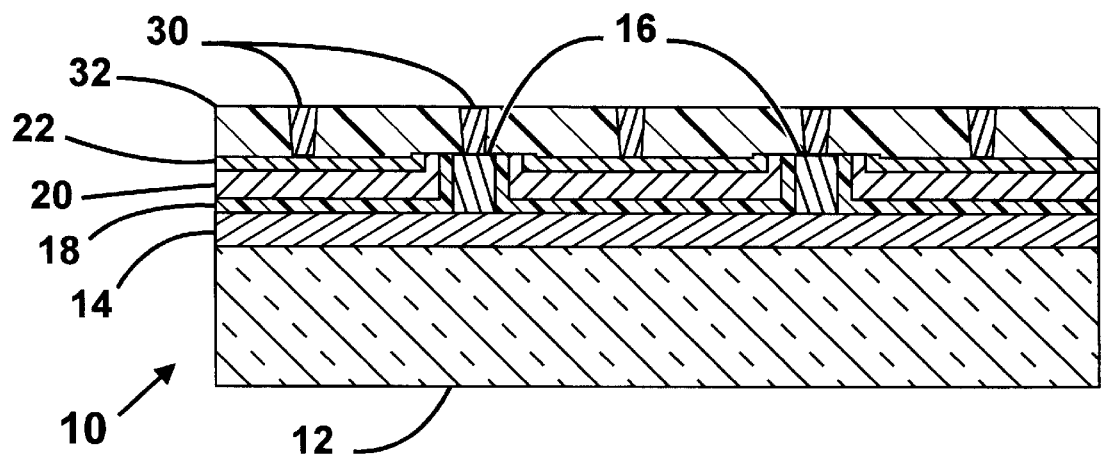

Once having formed posts 30, the photoresist layer may be stripped and a polyimide layer 32 may be formed over the top of layer 22 and posts 30, as shown in FIG. 7. As previously mentioned, layer 22 serves as an adhesion layer to improve the bonding strength of the polyimide to the underlying metal layer 20, and in some cases to act as a diffusion barrier if polyimide 32 and layer 20 have material incompatibilities. The polyimide layer 32 may then be polished flat by conventional CMP or polishing processes, the result of which being shown in FIG. 8. Copper/polyimide signal lines may then be fabricated on top of the structure shown in FIG. 8, where the signal interconnect layers may comprise bonding pads to which IC chips may be attached.

For capacitor applications, dielectric layer 18 has a typical thickness of 100 nm to 300 nm, and each of layers 14 and 20 has thickness of between 2 $\mu$m and 10 $\mu$m. Accordingly, the heights of posts 16 should be greater than these thicknesses. In preferred embodiments of these capacitor structures, the thickness of layer 20 is at least 20% of the height of post 16 (for good electrical conduction properties of both posts 16 and layer 20), and not more than 80% of the height of post 16 (distance "D" in FIG. 1), and preferably not more than 60% (to allow room for the other layers 18, 22 and 24 below the height level set by the tops of posts 16).

Although the structure illustrated in FIGS. 1 through 8 is intended for use as a substrate capacitor, it may be appreciated that, by using a thicker dielectric layer 18 and/or a lower dielectric constant for layer 18, the structure may be used as a signal interconnect structure where one set of signal lines is formed in layer 14, a second set is formed in layer 20, and where layer 18 electrically isolates the sets, and where posts 16 provide connections to the lower set from the top of the structure. For signal line applications, dielectric layer 18 has a typical thickness of 3 $\mu$m to 15 $\mu$m, and each of layers 14 and 20 has thickness of between 3 $\mu$m and 5 $\mu$m. In preferred embodiments of these interconnect structures, the thickness of layer 18 is at least 20% of the height of post 16 (for dielectric isolation and signal propagation properties of layers 14 and 20), and not more than 70% of the height of post 16 (to allow room for the other layers 18, 22 and 24 below the level set by the tops of posts 16).

While the present invention has been particularly described with respect to the illustrated embodiments, it will be appreciated that various alterations, modifications and adaptations may be made based on the present disclosure, and are intended to be within the scope of the present invention. While the invention has been described in connection with what is presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A method of forming a layer over an existing layer formed on a substrate with a pattern which is complementary and self-aligned to the pattern of the existing layer, the pattern of the existing layer having low portions spaced from the surface of the substrate by a first height and high portions spaced from the surface of the substrate by a second height which is greater than the first height, the difference between the first and second heights being denoted as a distance D, said method comprising the steps of:

(a) forming a first layer of a first material over the existing layer such that said first layer substantially conforms to and reproduces the pattern of the existing layer and has high and low portions whose locations substantially correspond to the locations of the high and low portions respectively of the existing layer, the low portions of said first layer being below the high portions of said existing layer, said first material having a chemical composition different from that of the material of the existing layer;

(b) forming a polish-stop layer of a second material over said first layer such that said polish-stop layer substantially conforms to and reproduces the pattern of said first layer and has high and low portions whose locations substantially correspond to the locations of the high and low portions respectively of the first layer, said second material having a chemical composition different from that of said first material; and (c) polishing the conformal first layer and polish-stop layer such that the high portions of said first layer and polish-stop layer are removed to expose the high portions of the existing layer, and such that the exposed pattern of the first layer which remains after the polishing step is self-aligned to the exposed pattern of the existing layer.

2. The method of claim 1 further comprising the step of (d) removing the remainder of said polish-stop layer following the step (c) of polishing, the exposed pattern of the first layer which remains after said steps (c) and (d) being complementary to the exposed pattern of the existing layer.

3. The method of claim 1 wherein the step (c) of polishing comprising the step of polishing the first layer such that the high portions of said first layer are at substantially the same height as the low portions of said stop layer.

4. The method of claim 1 wherein the step of polishing comprises the step of chemical-mechanical polishing.

5. The method of claim 1 further comprising the step of forming a second layer of a third material between said first layer and said stop layer, said second layer substantially conforming to and reproducing the pattern of said first layer and having high and low portions whose locations substantially correspond to the locations of the high and low portions respectively of the first layer, the low portions of said second layer being below the high portions of said existing layer.

6. The method of claim 5 wherein the thickness of the low portions of said second layer is at least 20% of the distance D between the first and second heights of the existing layer.

7. The method of claim 5 wherein the thickness of the low portions of said second layer is at least 3 $\mu$m.

8. The method of claim 5 wherein the thickness of the low portions of said second layer is not more than 60% of the distance D between the first and second heights of the existing layer.

9. The method of claim 1 wherein the thickness of the low portions of said first layer is at least 20% of the distance D the first and second heights of the existing layer.

10. The method of claim 1 wherein the thickness of the low portions of said first layer is at least 100 nm.

11. The method of claim 1 wherein the thickness of the low portions of said first layer is not more than 60% of the distance D between the first and second heights of the existing layer.

12. The method of claim 1 wherein the aggregate surface area of high portions of said first layer is less than 20% of the total surface area of said first layer.

13. A method of forming self-aligned layers comprising the steps of:

(a) forming a first patterned layer of a conductive material over a substrate, the pattern of the first layer and having low portions spaced from the surface of the substrate by a first height and high portions spaced from the surface of the substrate by a second height which is greater than the first height, the difference between the first and second heights being denoted as a distance D;

(b) forming a second layer of a dielectric material over said first layer such that said second layer substantially conforms to and reproduces the pattern of said first layer and has high and low portions whose locations substantially correspond to locations of the high and low portions respectively of said first layer, the low portions of said second layer being below the high portions of said first layer;

(c) forming a third layer of a conductive material over said second layer such that said third layer substantially conforms to and reproduces the pattern of said second layer and has high and low portions whose locations substantially correspond to locations of the high and low portions respectively of said second layer, the low portions of said third layer being below the high portions of said first layer;

(d) forming a polish-stop layer over said third layer such that said polish-stop layer substantially conforms to and reproduces the pattern of said third layer and has high and low portions whose locations substantially correspond to locations of the high and low portions respectively of the third layer, the material of said polish-stop layer having a chemical composition different from that of the material of said third layer; and (e) polishing the conformal second, third, and polish-stop layers such that the high portions of said first layer are exposed, and such that the exposed pattern of the third layer which remains after the polishing step is self-aligned to the pattern of the exposed second layer and to the pattern of the exposed first layer.

14. The method of claim 13 further comprising the step of (f) removing the remainder of said polish-stop layer following the step (e) of polishing, the exposed pattern of the third layer which remains after said steps (e) and (f) being complementary to the exposed pattern of the first layer and to the exposed pattern of the second layer.

15. The method of claim 13 wherein the step (e) of polishing comprising the step of polishing the second and third layers such that the high portions of said second and third layers are at substantially the same height as the low portions of said stop layer.

16. The method of claim 13 wherein the step of polishing comprises the step of chemical-mechanical polishing.

17. The method of claim 13 wherein the thickness of the low portions of said third layer is at least 20% of the distance D between the first and second heights of said first layer.

18. The method of claim 13 wherein the thickness of the low portions of said third layer is at least 3 $\mu$m.

19. The method of claim 13 wherein the thickness of the low portions of said third layer is not more than 60% of the distance D between the first and second heights of said first layer.

20. The method of claim 13 wherein the thickness of the low portions of said second layer is at least 20% of the distance D the first and second heights of said first layer.

21. The method of claim 13 wherein the thickness of the low portions of said second layer is at least 100 nm.

22. The method of claim 13 wherein the thickness of the low portions of said first layer is not more than 60% of the distance D between the first and second heights of said first layer.

23. The method of claim 13 wherein the aggregate surface area of high portions of said first layer is less than 20% of the total surface area of said first layer.

24. A method of forming self-aligned layers comprising the steps of:
   (a) forming a first patterned layer of a first material over a substrate, the pattern of the first layer and having low portions spaced from the surface of the substrate by a first height and high portions spaced from the surface of the substrate by a second height which is greater than the first height, the difference between the first and second heights being denoted as a distance D;
   (b) forming a second layer of a second material over said first layer such that said second layer substantially conforms to and reproduces the pattern of said first layer and has high and low portions whose locations substantially correspond to locations of the high and low portions respectively of said first layer, the low portions of said second layer being below the high portions of said first layer;
   (c) forming a third layer of a barrier material over said second layer such that said third layer substantially conforms to and reproduces the pattern of said second layer and has high and low portions whose locations substantially correspond to locations of the high and low portions respectively of said second layer, the low portions of said third layer being below the high portions of said first layer;
   (d) forming a polish-stop layer over said third layer such that said polish-stop layer substantially conforms to and reproduces the pattern of said third layer and has high and low portions whose locations substantially correspond to locations of the high and low portions respectively of the third layer, the material of said polish-stop layer having a chemical composition different from that of the material of said third layer;
   (e) polishing the conformal second, third, and polish-stop layers such that the high portions of said first layer are exposed, and such that the exposed pattern of the third layer which remains after the polishing step is self-aligned to the pattern of the exposed second layer and to the pattern of the exposed first layer;
   (f) removing the polish-stop layer after the polishing step; and
   (g) forming a polyimide layer over said third layer, the barrier material of said third layer preventing contact of the polyimide to the material of the third layer.

* * * * *

UNITED STATES PATENT AND TRADEMARK OFFICE
CERTIFICATE OF CORRECTION

Page 1 of 2

PATENT NO. : 6,025,244
DATED : February 15, 2000
INVENTOR(S) : Michael G. Lee, et. al.

It is certified that error appears in the above-indentified patent and that said Letters Patent is hereby corrected as shown below:

In the ABSTRACT, line 1, Delete "self aligned" and substitute therefor --self-aligned--.

In the ABSTRACT, line 18, Delete the second occurrence of "the first".

Column 1, line 66, After "specifically" insert --,--.

Column 2, line 27-28, Delete "chemical mechanical" and substitute therefor --chemical-mechanical--.

Column 3, line 33, Delete the second occurrence of "to the".

Column 3, line 45, Delete "which" and substitute therefor --that--.

Column 3, line 65, Delete "exemplry" and substitute therefor --exemplary--.

Column 4, line 14, Delete "well known" and substitute therefor --well-known--.

Column 4, line 17, After "sition" insert --,--.

Column 5, line 15, After "turn" insert --,--.

Column 5, line 30, Delete "meet" and substitute therefor --met--.

Column 5, line 41, After "thus" insert --,--.

Column 6, line 19, Delete "chemical mechanical" and substitute therefor --chemical-mechanical--.

UNITED STATES PATENT AND TRADEMARK OFFICE
CERTIFICATE OF CORRECTION

PATENT NO. : 6,025,244
DATED : February 15, 2000
INVENTOR(S) : Michael G. Lee, et. al.

It is certified that error appears in the above-indentified patent and that said Letters Patent is hereby corrected as shown below:

Column 8, line 39, After "22" insert --,--.

Column 8, line 56, After "22" insert --,--.

Column 8, line 60, After "modifications" insert --,--.

Signed and Sealed this

Tenth Day of April, 2001

*Attest:*

NICHOLAS P. GODICI

*Attesting Officer*  Acting Director of the United States Patent and Trademark Office